United States Patent
Kim

(10) Patent No.: US 8,503,243 B2
(45) Date of Patent: Aug. 6, 2013

(54) FLASH MEMORY DEVICE AND READING METHOD THEREOF

(75) Inventor: Boh-chang Kim, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 95 days.

(21) Appl. No.: 13/198,126

(22) Filed: Aug. 4, 2011

(65) Prior Publication Data

US 2012/0033499 A1 Feb. 9, 2012

(30) Foreign Application Priority Data

Aug. 5, 2010 (KR) ........................ 10-2010-0075672

(51) Int. Cl.
*G11C 11/34* (2006.01)

(52) U.S. Cl.
USPC ................................ 365/185.18; 365/185.24

(58) Field of Classification Search
USPC ....................................... 365/185.18, 185.24
See application file for complete search history.

(56) References Cited

U.S. PATENT DOCUMENTS

| 7,414,886 | B2 | 8/2008 | Li et al. | |
|---|---|---|---|---|
| 7,518,910 | B2 | 4/2009 | Chen et al. | |
| 7,864,590 | B2 * | 1/2011 | Kim et al. | 365/185.22 |
| 2007/0035997 | A1 * | 2/2007 | Shibata et al. | 365/185.03 |
| 2007/0260817 | A1 * | 11/2007 | Ha | 711/118 |
| 2009/0237979 | A1 * | 9/2009 | Mukai et al. | 365/148 |
| 2009/0303791 | A1 * | 12/2009 | Shibata et al. | 365/185.03 |

FOREIGN PATENT DOCUMENTS

KR 10-2006-0107716 A 10/2006

* cited by examiner

*Primary Examiner* — Michael Tran
(74) *Attorney, Agent, or Firm* — Lee & Morse, P.C.

(57) ABSTRACT

A flash memory device and reading method of the flash memory device. The reading method includes determining a read voltage set of memory cells corresponding to a first word line from at least one of flag cell data of the first word line and flag cell data of a second word line adjacent to the first word line, and reading the memory cells corresponding to the first word line according to the determined read voltage set.

18 Claims, 8 Drawing Sheets

FIG. 4A

|       | LF | MF |
|-------|----|----|
| WL$_{k+1}$ | 0 | 0 |
| WL$_k$ | 0 | 0 |

FIG. 4B

|       | LF | MF |
|-------|----|----|
| WL$_{k+1}$ | 0 | 1 |
| WL$_k$ | 0 | 0 |

FIG. 4C

|       | LF | MF |
|-------|----|----|
| WL$_{k+1}$ | 0 | 1 |
| WL$_k$ | 0 | 1 |

FIG. 4D

|       | LF | MF |
|-------|----|----|
| WL$_{k+1}$ | 1 | 1 |
| WL$_k$ | 0 | 1 |

FIG. 4E

|       | LF | MF |
|-------|----|----|
| WL$_{k+1}$ | 1 | 1 |
| WL$_k$ | 0 | 0 |

FLASH MEMORY DEVICE AND READING METHOD THEREOF

CROSS-REFERENCE TO RELATED APPLICATION

This application claims priority from Korean Patent Application No. 10-2010-0075672, filed on Aug. 5, 2010, in the Korean Intellectual Property Office, and entitled: "Flash Memory Device and Reading Method Thereof," and all the benefits accruing therefrom under 35 U.S.C. 119, the contents of which is incorporated by reference herein in its entirety.

BACKGROUND

1. Field

Embodiments relate to a flash memory device and a reading method thereof, and more particularly, to a flash memory device that controls a read voltage according to flag cell data, and a reading method thereof.

2. Description of the Related Art

A flash memory device is one type of non-volatile memory devices that may maintain stored data even if power is not supplied. In a flash memory device, if any one memory cell is programmed, dispersions of adjacent memory cells are changed due to a coupling effect between memory cells.

However, when a program operation of a flash memory cell is stopped at the middle of a memory block, memory cells connected to a word line that is finally programmed are not affected by a coupling effect, and thus, dispersions of the memory cells are inclined downward compared with other programmed memory cells.

SUMMARY

One or more embodiments may provide a flash memory device that controls a read voltage according to flag cell data, and a method of reading the flash memory device.

One or more embodiments may provide a method of reading a flash memory device, the method including determining a read voltage set of memory cells corresponding to a first word line from flag cell data of the first word line and flag cell data of a second word line adjacent to the first word line, and reading the memory cells corresponding to the first word line according to the determined read voltage set.

Determining the read voltage set of the memory cells corresponding to the first word line may include determining whether the first word line is a finally written word line from at least one of the group consisting of the flag cell data of the first word line and the flag cell data of the second word line, and determining a first read voltage set as the read voltage set of the memory cells corresponding to the first word line, when the first word line is not the finally written word line, and determining a second read voltage set as the read voltage set of the memory cells corresponding to the first word line, when the first word line is the finally written word line.

Determining whether the first word line is the finally written word line may include determining that the first word line is not the finally written word line when most significant bit (MSB) flag cell data of the second word line is in a first logic state.

Determining whether the first word line is the finally written word line may include determining that the first word line is the finally written word line when the MSB flag cell data of the second word line is in a second logic state.

Determining whether the first word line is the finally written word line may include determining that the first word line is the finally written word line when the MSB flag cell data of the second word line is in a second logic state and when MSB flag cell data of the first word line is in a first logic state.

When the MSB flag cell data of the first word line and the MSB flag cell data of the second word line is in the second logic state, determining whether the first word line is the finally written word line may include determining that the first word line is not the finally written word line when least significant bit (LSB) flag cell data of the second word line is in the first logic state, and determining that the first word line is the finally written word line when the LSB flag cell data of the second word line is in the second logic state.

When MSB flag cell data of the first word line is in a first logic state, determining whether the first word line is the finally written word line may include determining that the first word line is not the finally written word line when MSB flag cell data of the second word line is in the first logic state, and determining that the first word line is the finally written word line when the MSB flag cell data of the second word line is in a second logic state.

When the MSB flag cell data of the first word line is in the second logic state, determining whether the first word line is the finally written word line may include determining that the first word line is not the finally written word line when the MSB flag cell data of the first word line is in the second logic state when LSB flag cell data of the second word line is in the first logic state, and determining that the first word line is the finally written word line when the LSB flag cell data of the second word line is in the second logic state.

Determining whether the first word line is the finally written word line may include determining that the first word line is not the finally written word line when each flag cell data of the first word line is the same as corresponding flag cell data of the second word line.

Each of read voltages included in the second read voltage set may be smaller than corresponding read voltages included in the first read voltage set by a correction amount.

The correction amount may be determined according to at least one of the flag cell data of the first word line and relative positions of the read voltages included in the second read voltage set.

One or more embodiments may provide a flash memory device, including a memory cell array including a plurality of memory cells, a row decoder configured to control a word line voltage applied to word lines of the memory cell array, a page buffer connected to the memory cell array through a plurality of bit lines and configured to read data of the plurality of memory cells included in the memory cell array, and a read voltage controller configured to receive at least one of flag cell data of a first word line and flag cell data of a second word line adjacent to the first word line from the page buffer and determine a read voltage set for memory cells corresponding to the first word line according to the received flag cell data.

The read voltage controller may determine whether the first word line is a finally written word line according to the at least one received flag cell data, determines a first read voltage set as the read voltage set of the memory cells corresponding to the first word line, when the first word line is not the finally written word line, and determines a second read voltage set as the read voltage set of the memory cells corresponding to the first word line, when the first word line is the finally written word line.

Read voltages included in the second read voltage set may each be smaller than corresponding read voltages included in the first read voltage set by a correction amount.

The correction amount may be determined according to at least one of the flag cell data of the first word line and relative positions of the read voltages included in the second read voltage set.

One or more embodiments may provide a method of reading a flash memory device including a plurality of memory cells corresponding to a first word line and a plurality of memory cells corresponding to a second word line, the method including determining whether the first word line is a finally written word line based on flag cell data of the first word line and/or flag cell data of the second word line adjacent to the first word line, reading the memory cells corresponding to the first word line, wherein reading includes using a first voltage set during reading when the first word line is determined to be the finally written word line, using a second voltage set during reading when the first word line is determined not to be the finally written word line, the first voltage set being different than the using a first voltage set when the first second voltage set.

During memory cell programming, memory cells corresponding to the first word line may be programmed before memory cells corresponding to the second word line are programmed.

The flag cell data of each of the first and second word lines may include most significant bit flag cell data and least significant bit flag cell data.

Determining whether the first word line is a finally written word line may be based on at least the flag cell data of most significant bit data of the second word line.

The first voltage set and the second voltage set may each include at least one corresponding voltage distribution, wherein the at least one corresponding voltage distribution of the first voltage set may be relatively lower in voltage than the corresponding voltage distribution of the second voltage set.

BRIEF DESCRIPTION OF THE DRAWINGS

Features will become more apparent to those of ordinary skill in the art by describing in detail exemplary embodiments with reference to the attached drawings, in which:

FIGS. 4A through 4E illustrate tables depicting combinations of flag cell data that may be generated from the flash memory cell array of FIG. 1;

DETAILED DESCRIPTION

Figure 1:
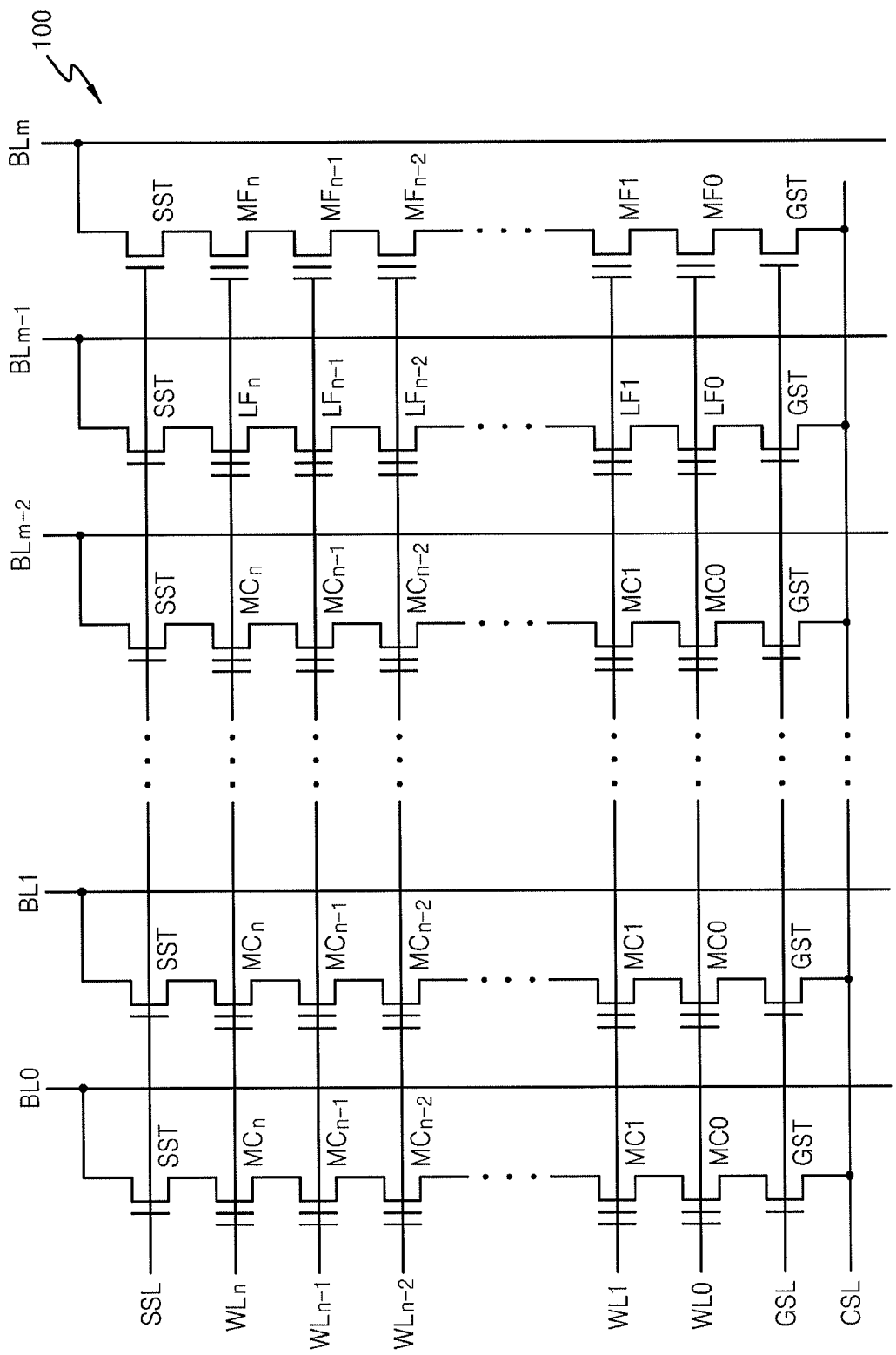
FIG. 1 illustrates a schematic diagram of an exemplary embodiment of a flash memory cell array employable in a flash memory device.

In the embodiments of the inventive concept, specific structural and functional details disclosed herein are merely representative for purposes of describing exemplary embodiments. Aspects of the inventive concept may, however, may be embodied in many alternate forms and should not be construed as limited to only the exemplary embodiments set forth herein.

Since the inventive concept may be embodied in many different forms, the embodiments of the inventive concept will be described in details with reference to the accompanying drawings. It should be understood, however, that there is no intent to limit exemplary embodiments to the particular forms disclosed, but on the contrary, exemplary embodiments are to cover all modifications, equivalents, and alternatives falling within the scope of the invention.

It will be understood that, although the terms first, second, third, etc., may be used herein to describe various elements, these elements should not be limited by these terms. These terms are only used to distinguish one element from another element. For example, a first element could be termed a second element and a second element could be termed a first element without departing from the teachings of exemplary embodiments.

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless defined differently, all terms used in the description including technical and scientific terms have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, exemplary embodiments will be described more fully with reference to the accompanying drawings. In the drawings, like reference numerals denote like elements.

FIG. 1 illustrates a schematic diagram of an exemplary embodiment of a flash memory cell array 100 employable in a flash memory device.

In the exemplary embodiment of FIG. 1, the flash memory cell array 100 is illustrated as a NAND flash memory cell array. The flash memory cell array 100 includes a plurality of flag cells, e.g., LF, MF. Referring to FIG. 1, the flash memory cell array 100 may include string selection transistors (SSTs), a plurality of memory cells MC0 through MCn, and ground selection transistors (GSTs). The plurality of memory cells MC0 through MCn may be connected between the SSTs and the GSTs and control gates of the plurality of memory cells MC0 through MCn may each be connected to corresponding word lines WL0 through WLn. Drains of the SSTs may be connected to corresponding bit lines BL0 through BLm. Gates of the SSTs may be connected to a string selection line (SSL). Also, sources of the GSTs may be connected to a common source line (CSL). Gates of the GSTs may be connected to a ground selection line (GSL). One SST, one GST, and the plurality of memory cells MC0 through MCn connected therebetween may be referred to as one string. Structure and operation of the memory cells MC0 through MCn, the string selection transistors SSTs, the ground selection transistors GSTs of FIG. 1 are well known to persons of ordinary skill in the art, and thus, a detailed description thereof will not be repeated.

Referring to FIG. 1, in one or more embodiments, the flash memory cell array 100 of FIG. 1 may include the flag cells LF0 through LFn and MF0 through MFn. The plurality of flag cells LF0 through LFn and MF0 through MFn may include least significant bit (LSB) flag cells LF0 through LFn and most significant bit (MSB) flag cells MF0 through MFn. The LSB flag cells may be cells that indicate whether the memory cells MC0 through MCn connected to the corresponding word lines WL0 through WLn are programmed to an LSB page. The MSB flag cells MF0 through MFn may be cells that indicate whether the memory cells MC0 through MCn connected to the corresponding word lines WL0 through WLn are programmed to an MSB page.

For example, when the LSB flag cell LF0 is programmed to a logic state "0", e.g., an off cell state, and when the MSB flag cell MF0 is programmed to a logic state "1", e.g., an on cell state, it may be determined that the memory cells MC0 of the corresponding word line WL0 are programmed to the LSB page. As another example, when the LSB flag cell LF0 and the MSB flag cell MF0 are both programmed to a logic state "0", e.g., both are in off cell states, it may be determined that the memory cells MC0 of the corresponding word line WL0 are programmed to the MSB page.

That is, in the flash memory cell array 100 having multi level cells (MCLs), each memory cell MC0 through MCn may be programmed to the LSB page or the MSB page. Thus, in one or more embodiments, data of the flag cells may be used to determine to which page the corresponding memory cells MC0 through MCn are programmed.

As described above, in one or more embodiments it may be determined whether the memory cells, e.g., MC0, of the corresponding word line, e.g., WL0, are programmed to the LSB page or the MSB page based on whether the LSB flag cell LF0 and the MSB flag cell MF0 are in on cell states or in off cell states. Embodiments are not, however, limited thereto, i.e., a method of determining that the memory cells MC0 of the corresponding word line WL0 are programmed to the LSB page or the MSB page according to the states of the flag cells LF0 and MF0 may vary.

In one or more embodiments, in the flash memory cell array, e.g., 100, at least one bit may be stored in one memory cell and flag cells equal in number to the number of bits that may be stored in one memory cell may be connected to each of the word lines, e.g., WL0 through WLn. More particularly, e.g., the memory cells MC0 through MCn included in the flash memory cell array 100 of FIG. 1 may each be an MLC that stores 2 bits of data and a pair (LF, MF) of the flag cells LF0 through LFn and MF0 through MFn may be connected to the word lines WL0 through WLn, respectively. While the exemplary flash memory cell array 100 is illustrated in FIG. 1, embodiments are not limited thereto.

Figure 2:
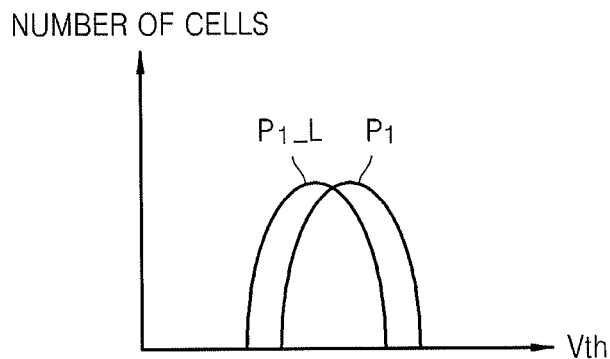
FIG. 2 illustrates a graph of dispersions of threshold voltages of memory cells included in a flash memory device according to an exemplary embodiment.

FIG. 2 illustrates a graph of dispersions of threshold voltages of memory cells included in a flash memory device according to an exemplary embodiment.

As described above, when a program operation of a flash memory cell is stopped at the middle of a cell block, memory cells connected to a word line that is finally programmed are not affected by a coupling effect, and thus, dispersions of the memory cells tend to be lower than those with other programmed memory cells.

Referring to FIG. 2, a first dispersion P1 is a threshold voltage dispersion of memory cells connected to word lines other than a finally written word line and a second dispersion P1_L is a threshold voltage dispersion of memory cells connected to the finally written word line. Here, the first dispersion P1 and the second dispersion P1_L illustrated in FIG. 2 may correspond to a threshold voltage dispersion when the same data is programmed to the memory cells. 'Write' may correspond to a program operation of a flash memory device.

Accordingly, as illustrated in FIG. 2, the second dispersion P1_L, which indicates the threshold voltage dispersion of the memory cells connected to the finally written word line, may have a lower threshold voltage level than that of the first dispersion P1, which indicates the threshold voltage dispersion of the memory cells connected to remaining word lines.

For example, in the flash memory cell array 100 of FIG. 1, when the same data is programmed from the word line WL0 to the word line WLn−1, a threshold voltage dispersion of the memory cells MCn−1 connected to the finally programmed word line WLn−1 may correspond to the second dispersion P1_L of FIG. 2 and a threshold voltage dispersion of the memory cells MC0 through MCn−2 connected to the remaining word lines WL0 through WLn−2 may correspond to the first dispersion P1 of FIG. 2.

Actually, the memory cells MC0 through MCn are programmed instead of the word lines WL0 through WLn, and thus, "a finally programmed word line" defined in this specification may be denoted as "a word line connected to finally programmed memory cells."

Figure 3:
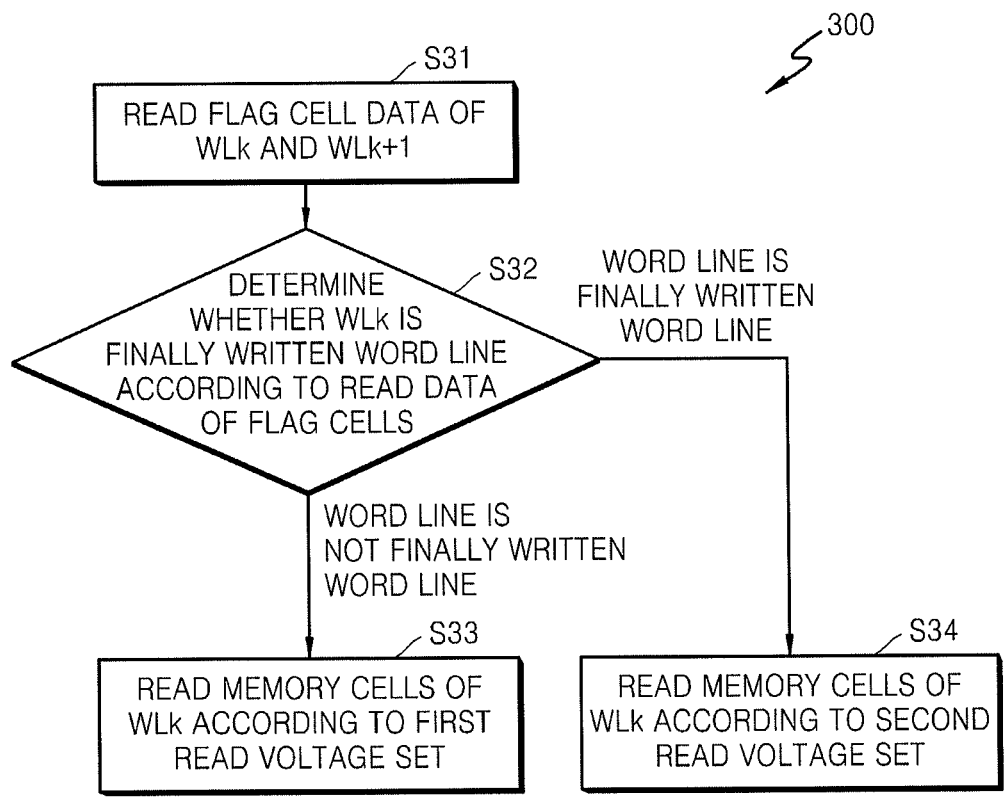
FIG. 3 illustrates a flowchart of an exemplary embodiment of a reading method of a flash memory device.

FIG. 3 illustrates a flowchart of an exemplary embodiment of a reading method 300 of a flash memory device. More particularly, e.g., the reading method 300 of a flash memory device illustrated in FIG. 3 relates to a method of reading data of memory cells on a first word line WLk. Here, k is a fixed number greater or equal to 0 and less than or equal to n.

Referring to FIG. 3, the reading method 300 of a flash memory device may include reading data of flag cells of the first word line WLk and a second word line WLk+1 (S31), determining whether the first word line WLk is a finally written word line according to the read data of the flag cells (S32), reading the memory cells of the first word line WLk according to a first read voltage set when the first word line WLk is not the finally written word line (S33), and/or reading the memory cells of the first word line WLk according to a second read voltage set when the first word line WLk is the finally written word line (S34).

Here, the first word line WLk is a kth word line from the flash memory cell array 100 of FIG. 1 and the second word line WLk+1 is a k+1th word line disposed upward from the first word line WLk. Also, it is assumed that memory cells MCk+1 connected to the second word line WLk+1 are programmed after memory cells MCk connected to the first word line WLk are programmed.

More particularly, referring to FIG. 3, in the reading method 300 of a flash memory device, data of all corresponding ones of the flag cells LFk, MFk, LFk+1, and MFk+1 of the first word line WLk and the second word line WLk+1 may be read before the data of the memory cells of the first word line WLk (S31). However, the reading method 300 of a flash memory device is not limited thereto. For example, all the data from the corresponding flag cells may not be read, e.g., only from one or some of the corresponding ones of flag cells, e.g., one or some of LFk, MFk, LFk+1, and MFk+1 of the first word line WLk and the second word line WLk+1 may be read.

Then, in the reading method 300 of a flash memory device, whether the first word line WLk is the finally written word line may be determined according to the read flag cells LFk, MFk, LFk+1, and/or MFk+1 (S32).

As an example, whether the first word line WLk is the finally written word line may be determined according to the data of the flag cell MFk+1 of the second word line WLk+1, which is an MSB flag cell. That is, when the data of the MSB flag cell MFk+1 of the second word line WLk+1 is "0," and thus, the MSB flag cell MFk+1 is in an off cell state, it is indicated that the second word line WLk+1 is programmed to an MSB page, and thus, it may be determined that the first word line WLk is not the finally written word line. Also, when the data of the MSB flag cell MFk+1 of the second word line WLk+1 is "1," and thus, the MSB flag cell MFk+1 is in an on cell state, it may be determined that the first word line WLk is the finally written word line. In this case, only the MSB page of the memory cells MC0 through MCn is considered.

The reading method 300 of a flash memory device is not limited thereto. For example, as described below with regard to FIGS. 4-6, various methods may be employed to determine whether a respective word line, e.g., a first word line, WLk is the finally written word line according to the flag cells, e.g., LFk, MFk, LFk+1, and/or MFk+1.

Referring to FIG. 3, when it is determined that the first word line WLk is not the finally written word line, the memory cells of the first word line WLk may be read according to the first read voltage set (S33). Here, the first read voltage set may be referred to as a normal read voltage set used to read data of the memory cells of the first word line WLk. When the memory cells to be read are MLCs, a plurality of read voltages that are different from each other are needed, and thus, the first read voltage set may include a plurality of read voltages.

More particularly, when the first word line WLk is not the finally written word line, it may be identified that the memory cells MCk of the first word line WLk are affected by a coupling effect when memory cells MCk+1 of the second word line WLk+1 are programmed. Accordingly, a threshold voltage dispersion of the memory cells of the first word line WLk may correspond to the first dispersion P1 of FIG. 2, and thus, the memory cells of the first word line WLk may be read according to the first read voltage set.

In one or more embodiments, when it is determined that the first word line WLk is the finally written word line, the memory cells of the first word line WLk may be read according to the second read voltage set (S34).

When the first word line WLk is the finally written word line, it may be identified that the memory cells of the first word line WLk are not affected by a coupling effect from the memory cells of the second word line WLk+1. Accordingly, the threshold voltage dispersion of the memory cells of the first word line WLk may correspond to the second dispersion P1_L of FIG. 2, and thus, the memory cells of the first word line WLk may be read according to the second read voltage set. Similar to the first read voltage set, when the memory cells to be read are MLCs, the second read voltage set may include a plurality of read voltages.

Since the second read voltage set may be referred to as read voltages for reading memory cells of a word line that is finally written, and thus, is not affected by the coupling effect, the read voltages included in the second read voltage set may each be lower by a correction amount than the corresponding read voltages included in the first read voltage set. As an example, three read voltages in each different level are needed in a reading operation of a flash memory device including MLCs that store 2 bits data. Here, when the first read voltage set includes V1, V2, and V3, the second read voltage set may include V1-a, V2-b, and V2-c. In one or more embodiments, the correction amounts a, b, and c may be differences in read voltages between the read voltages included in the first read voltage set and the second read voltage set and may vary according to the order of the read voltages in the read voltage sets.

Also, the correction amounts may vary according to whether the first word line WLk is programmed to an LSB page or the MSB page because a coupling effect due to the memory cells programmed to the LSB page may be different from a coupling effect due to the memory cells programmed to the MSB page, which will be described later in detail with reference to FIG. 7.

As described above, in one or more embodiments of the reading method 300, whether a corresponding word line is a finally written word line may be determined according to flag cell data of a word line, and accordingly, a level of the read voltage of memory cells connected to the corresponding word line may be controlled according to a result of the determination, and thus, data of the memory cells may be prevented from being incorrectly read. Also, in one or more embodiments of the reading method 300 of a flash memory device, the level of the read voltage may be controlled by using only the flag cell data of the word line, and thus, read voltages may be controlled in a short period of time and data of the memory cells may be read, e.g., with no and/or substantially no delay as a result of the determination.

FIGS. 4A through 4E illustrate tables depicting combinations of flag cell data that may be generated from the flash memory cell array 100 of FIG. 1. Referring to FIGS. 4A through 4E, LF may denote an LSB flag cell and MF may denote an MSB flag cell. Also, WLk may denote a first word line to be read and WLk+1 may denote a second word line to be read, e.g., an adjacent or upper word line relative to the first word line. In addition, "0" may be data that denotes that a corresponding flag cell is an off cell and "1" may be data that denotes that a corresponding flag cell is an on cell.

The table of FIG. 4A indicates that the flag cells LF and MF of the first word line WLk and the flag cells LF and MF of the second word line WLk+1 are off cells. Accordingly, the table indicates that memory cells MCk of the first word line WLk and memory cells MCk+1 of the second word line WLk+1 are all programmed to an MSB page. In this regard, the table illustrates that the memory cells MCk of the first word line WLk are programmed to the MSB page and then the memory cells MCk+1 of the second word line WLk+1 are also programmed to the MSB page, and thus, the first line WLk is not a finally written word line.

The table of FIG. 4B indicates that the flag cells LF and MF of the first word line WLk and the flag cell LF of the second word line WLk+1 are off cells, whereas the flag cell MF of the second word line WLk+1 is an on cell. Accordingly, the table indicates that the memory cells MCk of the first word line WLk are programmed to an MSB page and the memory cells MCk+1 of the second word line WLk+1 are programmed to an LSB page. However, in a general flash memory device, the LSB page is firstly programmed in a flash memory cell array and then the MSB page is programmed. In this regard, the table illustrates that the memory cells MCk of the first word line WLk are programmed to the MSB page and then the memory cells MCk+1 of the second word line WLk+1 are not programmed to the MSB page. Thus, the memory cells MCk of the first word line WLk are not affected by a coupling effect from the memory cells MCk+1 of the second word line WLk+1, and thus, it may be determined that the first word line WLk is a finally written word line. Therefore, the table indicates that the first word line WLk is a finally written word line.

The table of FIG. 4C indicates that the flag cells LF of the first word line WLk and the second word line WLk+1 are off cells, whereas the flag cells MF of the first word line WLk and the second word line WLk+1 are an on cells. Accordingly, the table indicates that the memory cells MCk of the first word line WLk and the memory cells MCk+1 of the second word line WLk+1 are all programmed to an LSB page. In this regard, the table illustrates that the memory cells MCk of the first word line WLk are programmed to the LSB page and then the memory cells MCk+1 of the second word line WLk+1 are also programmed to the LSB page, and thus, the first word line WLk is not a finally written word line.

The table of FIG. 4D indicates that the flag cell LF of the first word line WLk is an off cell, whereas the flag cell MF of the first word line WLk and the flag cells LF and MF of the second word line WLk+1 are on cells. Accordingly, the table indicates that the memory cells MCk of the first word line WLk are programmed to an LSB page and the memory cells MCk+1 of the second word line WLk+1 are not programmed. In this regard, the table illustrates that the first word line WLk is a finally written word line.

The table of FIG. 4E indicates that the flag cells LF and MF of the first word line WLk are off cells, whereas the flag cells LF and MF of the second word line WLk+1 are on cells. Accordingly, the table indicates that the memory cells MCk of the first word line WLk are programmed to an MSB page and the memory cells MCk+1 of the second word line WLk+1 are not programmed. In this regard, the table illustrates that the first word line WLk is a finally written word line.

Referring to FIGS. 4A through 4E, the tables of FIGS. 4A and 4C indicate that the first word line WLk is not a finally written word line and the tables of FIGS. 4B, 4D, and 4E indicate that the first word line WLk is a finally written word line. As described above, by using various methods, whether the first word line WLk is a finally written word line may be determined according to the flag cells LF, MF of the first word line WLk and/or the second word line WLk+1.

As an example, in the tables of FIGS. 4A and 4C, the LF of the first word line WLk may have the same value as the LF of the second word line WLk+1 and the MF of the first word line WLk may have the same value as the MF of the second word line WLk+1. Thus, when an exclusive OR (XOR) operation is performed on the LF of the first word line WLk and the LF of the second word line WLk+1, and thus, obtains "0" and when an XOR operation is performed on the MF of the first word line WLk and the MF of the second word line WLk+1, and thus, obtains "0", it may be determined that the first word line WLk is not a finally written word line. In the tables of FIGS. 4B, 4D, and 4E, which indicate that the first word line WLk is a finally written word line, the above condition may not be satisfied.

While FIGS. 4A through 4E illustrate exemplary scenarios combinations of flag cell data that may be generated from the flash memory cell array 100 of FIG. 1, embodiments are not limited thereto. Other methods and/or variations to the method 300 may be employed to determine whether a respective word line, e.g., the first word line WLk, is a finally written word line according to the flag cells, e.g., LF, MF, of the first word line WLk and the second word line WLk+1.

Further, e.g., FIG. 4 assumes that the memory cells included in the flash memory cell array may include 2 bit data and that two flag cells LF and MF are connected to each of the word lines WL0 through WLn. However, embodiments of the reading method are not limited thereto. For example, one or more embodiments of the reading method, e.g., 300, may be applied to a flash memory device including memory cells that may store one bit data or more than 2 bit data.

Figure 5:
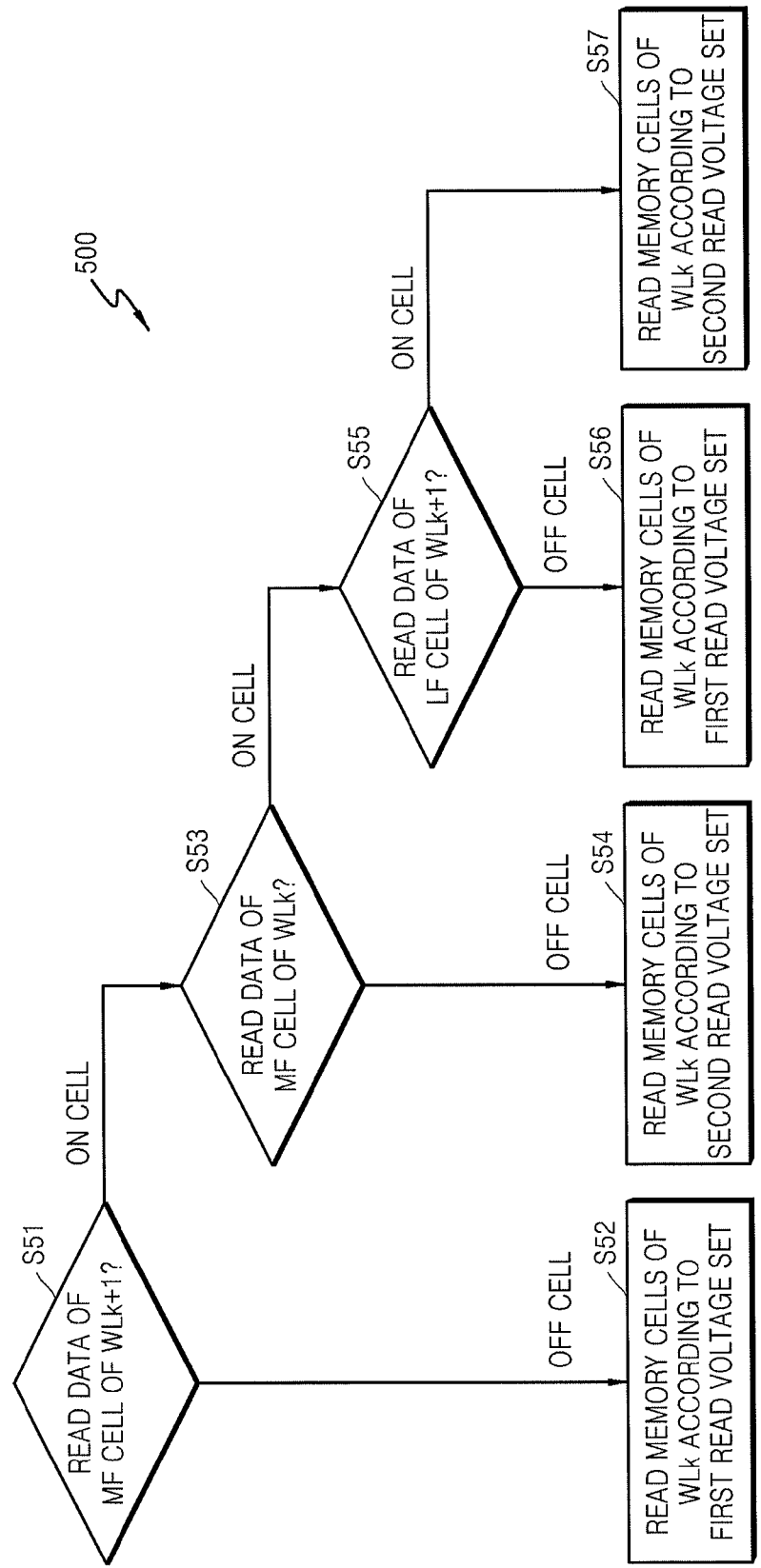
FIG. 5 illustrates a flowchart of another exemplary embodiment of a reading method of a flash memory device.

FIG. 5 illustrates a flowchart of another exemplary embodiment of a reading method 500 of a flash memory device. More particularly, the reading method 500 of a flash memory device illustrated in FIG. 5 relates to a method of reading data of memory cells on a first word line WLk.

Referring to FIG. 5, the reading method 500 of the flash memory device may include reading data of an MSB flag cell MF of a second word line WLk+1 (S51), and, when the MSB flag cell MF of the second word line WLk+1 is in an off cell state, reading data of memory cells MCk of the first word line WLk according to a first read voltage set (S52).

Referring to FIG. 5, when the MSB flag cell MF of the second word line WLk+1 is in an on cell state, the reading method 500 may include reading data of an MSB flag cell MF of the first word line WLk (S53). When the MSB flag cell MF of the first word line WLk is in an off cell state, the reading method 500 may include reading the data of the memory cells MCk of the first word line WLk according to a second read voltage set (S54).

Referring to FIG. 5, when the MSB flag cell MF of the first word line WLk is in an on cell state, the reading method 500 may further include reading data of an LSB flag cell LF of the second word line WLk+1 (S55). When the LSB flag cell LF of the second word line WLk+1 is in an off cell state, the reading method 500 may include reading the data of the memory cells MCk of the first word line WLk according to the first read voltage set (S56). When the LSB flag cell LF of the second word line WLk+1 is in an on cell state, the reading method 500 may include reading the data of the memory cells MCk of the first word line WLk according to the second read voltage set (S57).

In the reading method 500 of a flash memory device, when the MSB flag cell MF of the second word line WLk+1 is in an off cell state, the data of the memory cells MCk of the first word line WLk may be read according to the first read voltage set (S52). That is, when the MSB flag cell MF of the second word line WLk+1 is in an off cell state, the MSB flag cell MF of the first word line WLk is also in an off cell state, and thus, the memory cells MCk of the first word line WLk are programmed to an MSB page and then memory cells MCk+1 of the second word line WLk+1 are also programmed to the MSB page.

Accordingly, in S52 of FIG. 5, the first line WLk is not a finally written word line, and thus, the data of the memory cells MCk of the first word line WLk may be read according to the first read voltage set. Here, since the memory cells MCk of the first word line WLk are programmed to the MSB page, the first read voltage set may include three read voltages. Operation S52 of FIG. 5 may correspond to the table of FIG. 4A.

In the reading method 500 of a flash memory device, the data of the memory cells MCk of the first word line WLk may be read according to the second read voltage set, when the MSB flag cell MF of the second word line WLk+1 is in an on state and the MSB flag cell MF of the first word line WLk is in an off cell state (S54). That is, when the MSB flag cell MF of the second word line WLk+1 is in an on state and the MSB flag cell MF of the first word line WLk is in an off cell state, the memory cells MCk of the first word line WK1 are programmed to the MSB page and the memory cells MCk+1 of the second word line WLk+1 are programmed to an LSB page.

Thus, since the memory cells MCk of the first word line WK1 are not affected by a coupling effect from the memory cells MCk+1 of the second word line WLk+1, the first word line WLk in operation S54 of FIG. 5 is the finally written word line. Accordingly, the data of the memory cells MCk of the first word line WLk may be read according to the second read voltage set. Here, since the memory cells MCk of the first word line WLk are programmed to the MSB page, the second voltage set may include three read voltages. Operation S54 of FIG. 5 may correspond to the tables of FIGS. 4B and 4E.

In the reading method 500 of a flash memory device, the data of the memory cells MCk of the first word line WLk may be read according to the first read voltage set, when the MSB flag cells MF of the first word line WLk and the second word line WLk+1 are in on cell states and the LSB flag cell LF of the second word line WLk+1 is in an off cell state (S56). That is, when the MSB flag cells MF of the first word line WLk and the second word line WLk+1 are in an on cell state and the LSB flag cell LF of the second word line WLk+1 is in an off cell state, the LSB flag cell LF of the first word line WLk is also in an off cell state, and thus, the memory cells MCk of the first word line WLk are programmed to the LSB page and then the memory cells MCk+1 of the second word line WLk+1 are programmed to the LSB page.

Accordingly, in operation S56 of FIG. 5, the first line WLk is not the finally written word line, and thus, the data of the memory cells MCk of the first word line WLk may be read according to the first read voltage set. Here, since the memory cells MCk of the first word line WLk are programmed to the LSB page, the first read voltage set may include one read voltage. Operation S56 of FIG. 5 may correspond to the table of FIG. 4C.

In the reading method 500 of a flash memory device, the data of the memory cells MCk of the first word line WLk may be read according to the second read voltage set, when the MSB flag cells MF of the first word line WLk and the second word line WLk+1 and the LSB flag cell LF of the second word line WLk+1 are in on cell states (S57). That is, when the MSB flag cells MF of the first word line WLk and the second word line WLk+1 and the LSB flag cell LF of the second word line WLk+1 are in on cell states, the memory cells MCk of the first word line WLk are programmed to the LSB page and the memory cells MCk+1 of the second word line WLk+1 are not programmed.

Thus, since the memory cells MCk of the first word line WK1 are not affected by a coupling effect from the memory cells MCk+1 of the second word line WLk+1, the first word line WLk in operation S57 of FIG. 5 is the finally written word line. Accordingly, the data of the memory cells MCk of the first word line WLk may be read according to the second read voltage set. Here, since the memory cells MCk of the first word line WLk are programmed to the LSB page, the second read voltage set may include one read voltage. Operation S57 of FIG. 5 may correspond to the table of FIG. 4D.

In one or more embodiments of a reading method 500 of a flash memory device, whether the first word line WLk is the finally written word line may be determined by using the flag cell data of the first word line WLk and the second word line WLk+1, and as a result of the determination, the read voltage for reading the memory cells MCk of the first word line WLk may be controlled. Also, when the read voltage is controlled, to which page the memory cells MCk of the first word line WLk is programmed may be considered.

Figure 6:
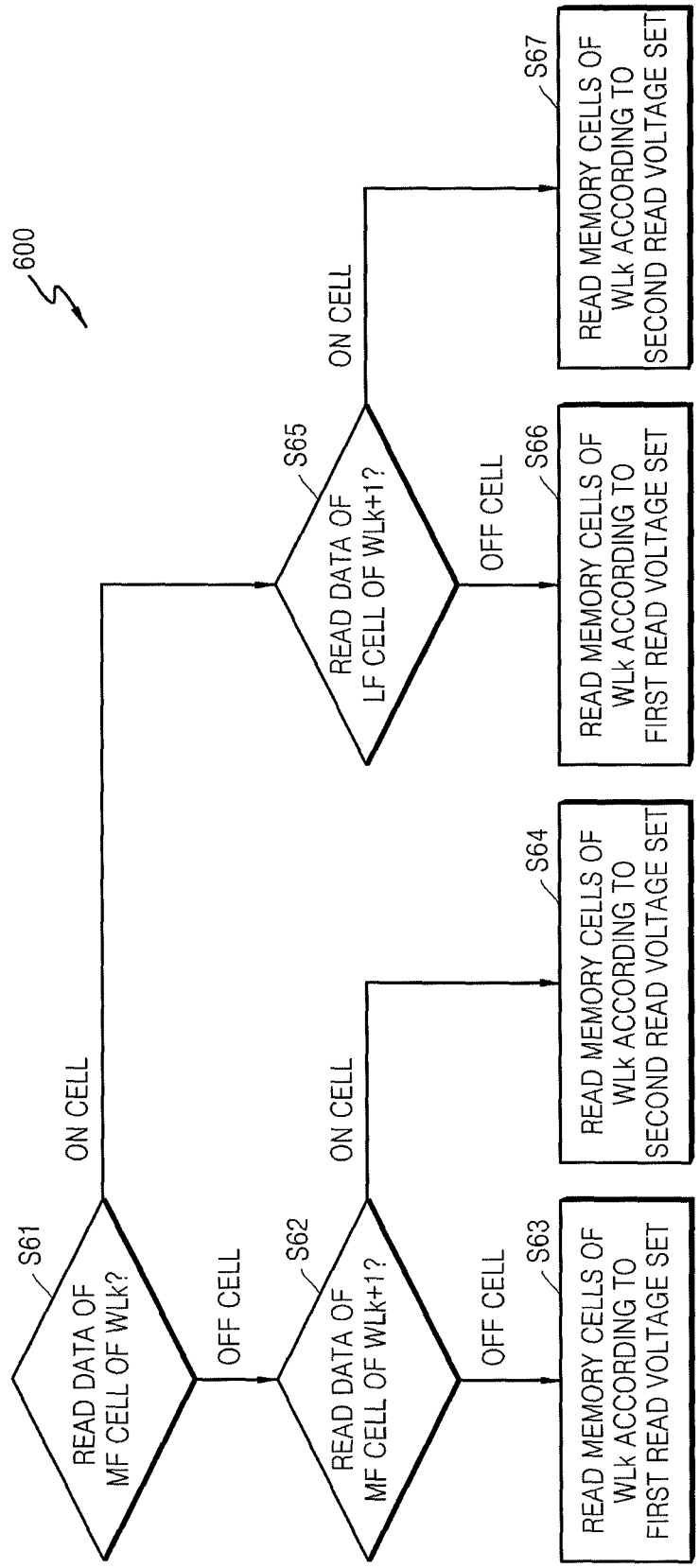
FIG. 6 illustrates a flowchart of another exemplary embodiment of a reading method of a flash memory device.

FIG. 6 illustrates a flowchart of another exemplary embodiment of a reading method 600 of a flash memory device. More particularly, the reading method 600 of a flash memory device relates to a method of reading data of memory cells on a first word line WLk.

Referring to FIG. 6, the reading method 600 of a flash memory device may include reading data of an MSB flag cell MF of the first word line WLk (S61), reading data of an MSB flag cell MF of the second word line WLk+1 when the MSB flag cell MF of the first word line WLk is in an off cell state (S62), reading data of memory cells MCk of the first word line WLk according to a first read voltage set when the MSB flag cell MF of the second word line WLk+1 is in an off cell state (S63), and reading the data of the memory cells MCk of the first word line WLk according to a second read voltage set when the MSB flag cell MF of the second word line WLk+1 is in an on cell state (S64).

The reading method 600 of a flash memory device may further include reading data of an LSB flag cell LF of the second word line WLk+1 when the MSB flag cell MF of the first word line WLk is in an on cell state (S65), reading the data of the memory cells MCk of the first word line WLk according to the first read voltage set when the LSB flag cell LF of the second word line WLk+1 is in an off cell state (S66), and reading the data of the memory cells MCk of the first word line WLk according to the second read voltage set when the LSB flag cell LF of the second word line is in an on cell state (S67).

The reading method 600 of a flash memory device of FIG. 6, including the reading of the data of the memory cells MCk of the first word line WLk according to the first read voltage set or the second voltage set, may be similar to the reading method 500 of a flash memory device of FIG. 5, but may determine whether the first word line WLk is a finally written word line differently. Thus, repetitive descriptions thereof will be omitted.

Exemplary reading methods, e.g., 300, 500, 600, employable for reading flash memory device according to the embodiments of the inventive concept are described with reference to FIGS. 3 through 6. Embodiments of the reading method of the flash memory device are not limited thereto and may vary.

Also, the reading methods of the flash memory device according to the embodiments of the inventive concept are described on the assumption that the memory cells are MLCs that may store 2 bits of data. However, embodiments are not limited thereto and may, e.g., be applied to MLCs that may store 3 or more bits of data.

Figure 7A:
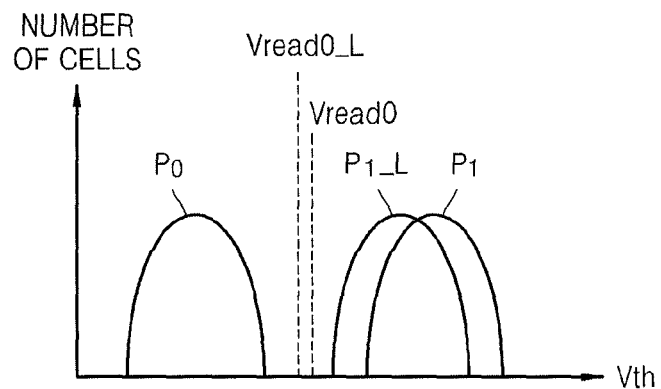
FIGS. 7A and 7B illustrate graphs of read voltages controlled according to a reading method of a flash memory device.
Figure 7B:
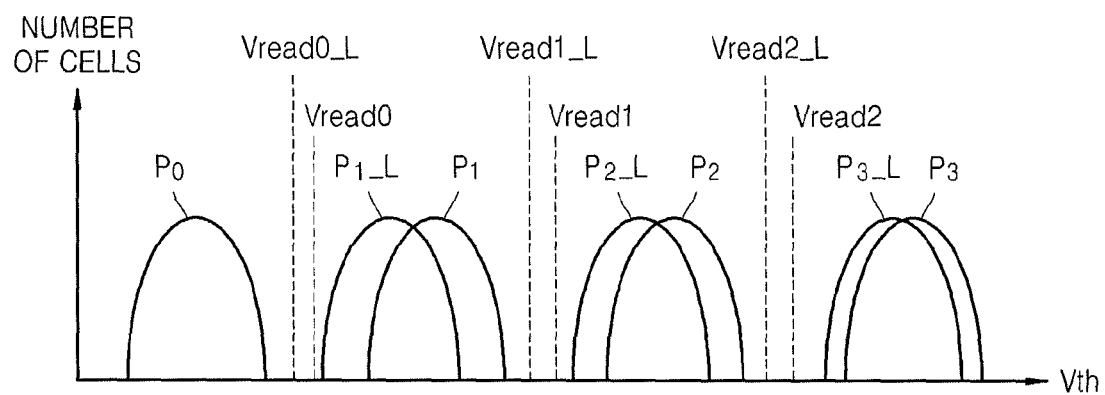

FIGS. 7A and 7B illustrate graphs of read voltages controlled according to a reading method of a flash memory device. Similar to FIG. 2, first, second, and third dispersions P1, P2, and P3 are threshold voltage dispersions of memory cells connected to word lines other than a finally written word line and first, second, and third dispersions P1_L, P2_L, and P3_L are threshold voltage dispersions of memory cells connected to the finally written word line.

FIG. 7A illustrates controlling of a read voltage when memory cells MCk of a first word line WLk are programmed to an LSB page.

When the memory cells MCk of the first word line WLk are programmed to the LSB page and the first word line WLk is not the finally programmed word line (see, e.g., table of FIG. 4C), data of the memory cells MCk of the first word line WLk may be read according to a first read voltage set. Referring to FIG. 7A, the first read voltage set may include a first read voltage Vread0.

When the memory cells MCk of the first word line WLk are programmed to the LSB page and the first word line WLk is the finally programmed word line (see, e.g., table of FIG. 4D), the data of the memory cells MCk of the first word line may be read according to a second read voltage set. Referring to FIG. 7A, the second read voltage set may include a first read voltage Vread0_L. The first read voltage Vread0_L included in the second read voltage set may be set to be smaller than the first read voltage Vread0 included in the first read voltage set by a first correction amount. Here, the first correction amount may be a difference in threshold voltages between the first dispersion P1 and the first dispersion P1_L.

FIG. 7B illustrates controlling of the read voltage when the memory cells MCk of the first word line WLk are programmed to an MSB page.

When the memory cells MCk of the first word line WLk are programmed to the MSB page and the first word line WLk is not the finally programmed word line (the table of FIG. 4A), the data of the memory cells MCk of the first word line WLk may be read according to the first read voltage set. Referring to FIG. 7B, the first read voltage set may include the first read voltage Vread0, a second read voltage Vread1, and a third read voltage Vread2. As described above, when the memory cells MCk of the first word line WLk are programmed to the MSB page, 2 bits of data is stored in the memory cells MCk, and thus, three read voltages may be needed to read data.

When the memory cells MCk of the first word line WLk are programmed to the MSB page and the first word line WLk is the finally programmed word line (the tables of FIGS. 4B and 4E), the data of the memory cells MCk of the first word line WLk may be read according to the second read voltage set. Referring to FIG. 7B, the second read voltage set may include the first read voltage Vread0_L, a second read voltage Vread1_L, and a third read voltage Vread2_L. The first read voltage Vread0_L, the second read voltage Vread1_L, and the third read voltage Vread2_L included in the second read voltage set may each be set to be an intermediate value between dispersions in consideration of relative positions of the first read voltage Vread0_L, the second read voltage Vread1_L, and the third read voltage Vread2_L.

Accordingly, the first read voltage Vread0_L included in the second read voltage set may be set to be smaller than the first read voltage Vread0 included in the first read voltage set by the first correction amount. Here, the first correction amount may be a difference in the threshold voltages between the first dispersion P1 and the first dispersion P1_L. Similarly, the second read voltage Vread1_L and the third read voltage Vread2_L included in the second read voltage set may be set to be smaller than the second read voltage Vread1 and the third read voltage Vread2 by a second correction amount and a third correction amount, respectively.

Here, the first correction amount, the second correction amount, and the third correction amount may be set to be different from each other according to relative positions of the read voltages. A general flash memory cell array may be less affected by a coupling effect as a threshold voltage increases, and thus, a difference in threshold voltages between the third dispersions P3 and P3_L may be smaller than a difference in threshold voltages between the second dispersions P2 and P2_L. Similarly, the difference in the threshold voltages between the second dispersions P2 and P2_1_, may be smaller than the difference in the threshold voltages between the first dispersions P1 and P1_L. In this regard, the first correction amount, the second correction amount, and the third correction amount may be set to be different from each other. However, embodiments are not limited thereto and the correction amounts may vary according to a state of a flash memory cell array.

Also, the correction amounts may be different from each other according to whether the first word line WLk is programmed to the LSB page or the MSB page. That is, the first correction amount indicating the difference between the first read voltages Vread0 and Vread0_L in FIG. 7A may be different from the first correction amount indicating the difference between the first read voltages Vread0 and Vread0_L in FIG. 7B. However, embodiments are not limited thereto and the correction amounts may vary according to a state of a flash memory cell array.

Figure 8:
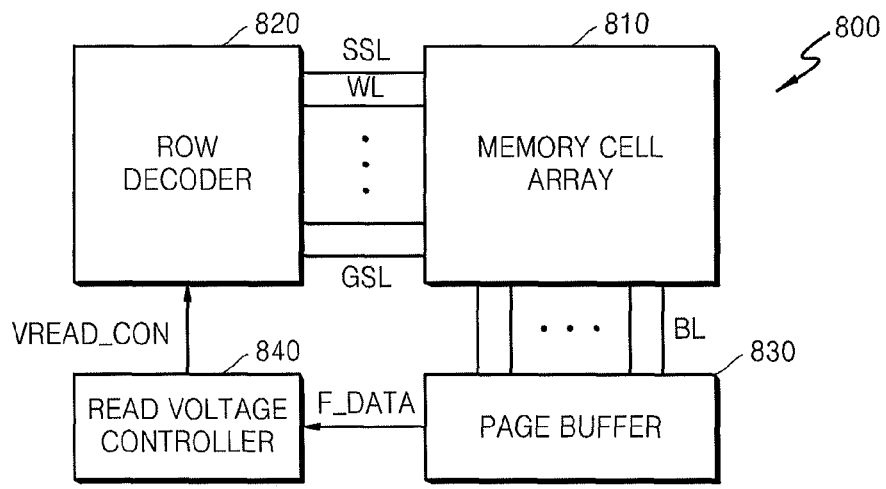
FIG. 8 illustrates a block diagram of an exemplary embodiment of a flash memory device.

FIG. 8 illustrates a block diagram of an exemplary embodiment of a flash memory device 800. Referring to FIG. 8, the flash memory device 800 may include a memory cell array 810, a row decoder 820, a page buffer 830, and a read voltage controller 840. Structures and operations of the memory cell array 810, the row decoder 820, and the page buffer 830 are well known to one of ordinary skill in the art, and thus, a detailed description thereof will not be repeated.

The read voltage controller 840 may receive flag cell data F_DATA from the page buffer 830. As described with reference to FIG. 3, the flag cell data F_DATA may include data from at least one of flag cells LF and MF of a first word line WLk and a second word line WLk+1. The read voltage controller 840 determines whether the first word line WLk is a finally written word line according to the received flag cell data F_DATA, and accordingly, may determine a read voltage set for memory cells MCk of the first word line WLk. The read voltage controller 840 generates a read voltage control signal VREAD_CON according to the determined read voltage set and outputs the generated read voltage control signal VREAD_CON to the row decoder 820. Accordingly, the flash memory device 800 according to the current embodiment of the inventive concept may read data of the memory cells MCk of the first word line WLk according to the read voltage set determined in the read voltage controller 840.

An operation of the read voltage controller 840 is similar to the descriptions with respect to FIGS. 3 through 7, and thus, it would have been obvious to one of ordinary skill in the art to realize the read voltage controller 840. Accordingly, a detailed description of the read voltage controller 840 of FIG. 8 is omitted.

Figure 9:
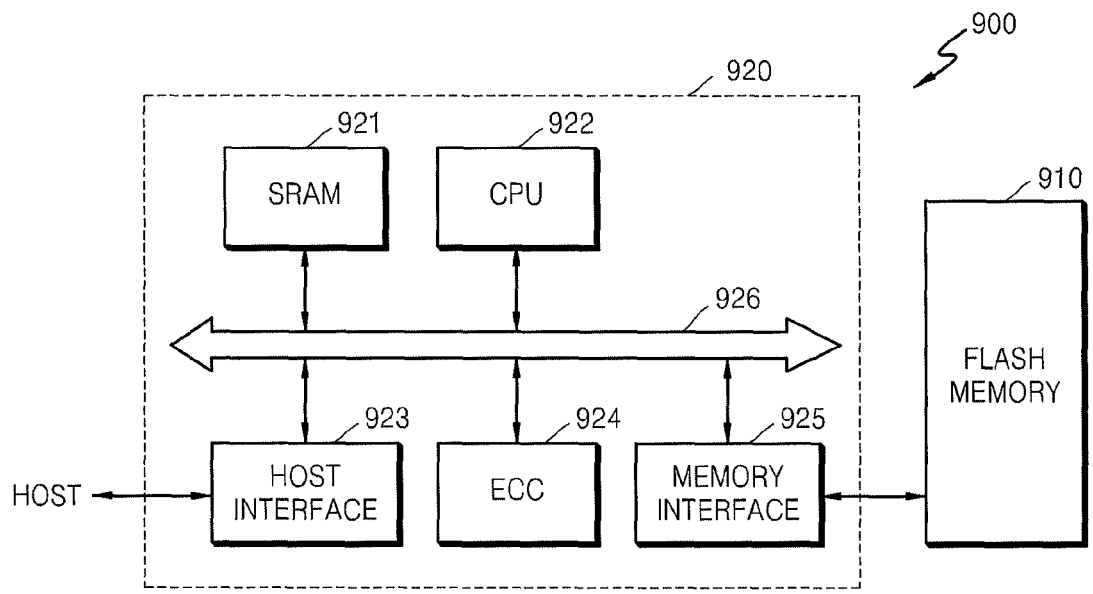
FIG. 9 illustrates a block diagram of an exemplary embodiment of a memory card including a flash memory device.

FIG. 9 illustrates a block diagram of an exemplary embodiment of a memory card 900 including a flash memory device. Referring to FIG. 9, the memory card 900 may include a flash memory device 910 and a memory controller 920. The memory controller 920 may be configured to communicate with an outside element (for example, a host) through one of various interface protocols such as USB, MMC, PCI-E, SATA, PATA, SCSI, ESDI, and IDE. The structures and operations of a SRAM 921, a CPU 922, a host interface 923, an ECC 924, a memory interface 925, and a bus 926 are well known to one of ordinary skill in the art, and thus, a detailed description thereof will not be repeated.

The memory controller 920 and the flash memory device 910 may, e.g., correspond to a solid state drive/disk (SSD) in which a non-volatile memory is used to store data. Here, the memory card and the SSD may be referred to as a memory system.

Figure 10:
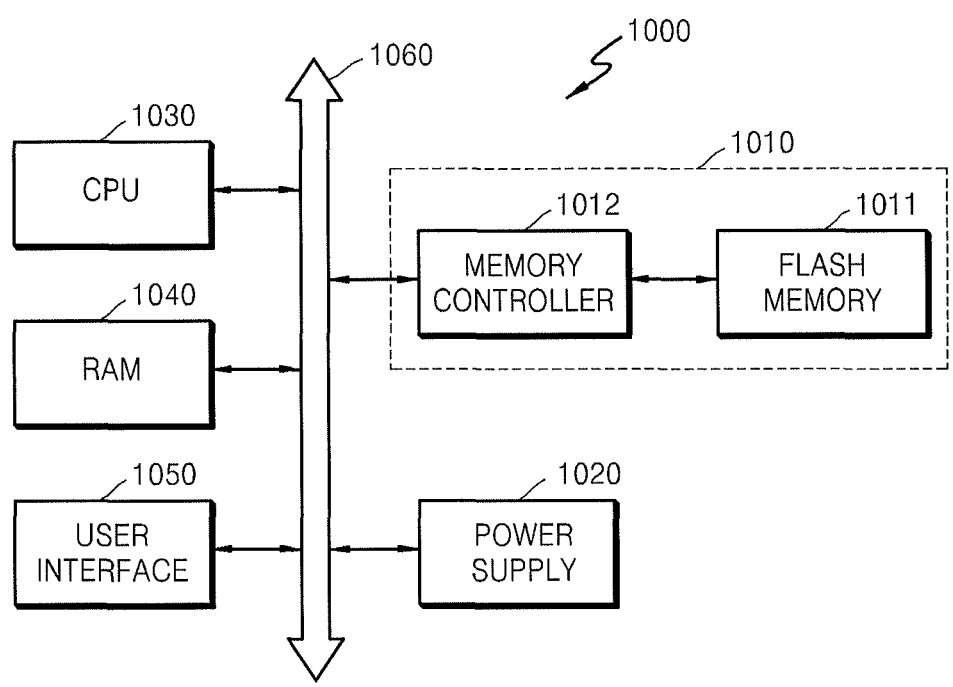
FIG. 10 illustrates a block diagram of an exemplary embodiment of a computing system including a flash memory device.

FIG. 10 illustrates a block diagram of an exemplary embodiment of a computing system 1000 including a flash memory device. Referring to FIG. 10, the computing system 1000 may include a CPU 1030 electrically connected to a bus 1060, a user interface 1050, and a flash memory system 1010 including a memory controller 1012 and a flash memory device 1011. The computing system 1000 may further include a RAM 1040 and a power supply device 1020.

The flash memory system 1010 of FIG. 10 may correspond to the memory card 900 of FIG. 9. The flash memory device 1011 may store N-bit data (N is a fixed number of 1 or above) processed or to be processed by the CPU 1030 through the memory controller 1012.

In one or more embodiments in which the computing system 1000 is a mobile device, a battery for supplying an operational voltage of the computer system 1000 and a modem such as a baseband chipset may be further provided. Also, an application chipset, a camera image processor, a mobile DRAM, and the like may be further provided to the computing system 1000, as well known to one of ordinary skill in the art, and thus, further a detailed description will not be repeated.

One or more embodiments of the flash memory device may be installed by using various forms of packages, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), and the like.

One or more embodiments of a flash memory device and reading method of a flash memory device may control read voltages according to flag cell data.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of reading a flash memory device, the method comprising:
    determining a read voltage set of memory cells corresponding to a first word line from flag cell data of the first word line and flag cell data of a second word line adjacent to the first word line; and
    reading the memory cells corresponding to the first word line according to the determined read voltage set, wherein determining the read voltage set of the memory cells corresponding to the first word line includes:
        determining whether the first word line is a finally written word line from at least one of the group consisting of the flag cell data of the first word line and the flag cell data of the second word line; and
        determining a first read voltage set as the read voltage set of the memory cells corresponding to the first word line, when the first word line is not the finally written word line, and determining a second read voltage set as the read voltage set of the memory cells corresponding to the first word line, when the first word line is the finally written word line.

2. The method as claimed in claim 1, wherein determining whether the first word line is the finally written word line includes determining that the first word line is not the finally written word line when most significant bit (MSB) flag cell data of the second word line is in a first logic state.

3. The method as claimed in claim 2, wherein determining whether the first word line is the finally written word line includes determining that the first word line is the finally written word line when the MSB flag cell data of the second word line is in a second logic state.

4. The method as claimed in claim 2, wherein determining whether the first word line is the finally written word line includes determining that the first word line is the finally written word line when the MSB flag cell data of the second word line is in a second logic state and when MSB flag cell data of the first word line is in a first logic state.

5. The method as claimed in claim 4, wherein, when the MSB flag cell data of the first word line and the MSB flag cell data of the second word line is in the second logic state, determining whether the first word line is the finally written word line includes:
    determining that the first word line is not the finally written word line when least significant bit (LSB) flag cell data of the second word line is in the first logic state; and
    determining that the first word line is the finally written word line when the LSB flag cell data of the second word line is in the second logic state.

6. The method as claimed in claim 1, wherein, when MSB flag cell data of the first word line is in a first logic state, determining whether the first word line is the finally written word line includes:
    determining that the first word line is not the finally written word line when MSB flag cell data of the second word line is in the first logic state; and
    determining that the first word line is the finally written word line when the MSB flag cell data of the second word line is in a second logic state.

7. The method as claimed in claim 6, wherein, when the MSB flag cell data of the first word line is in the second logic state, determining whether the first word line is the finally written word line includes:
    determining that the first word line is not the finally written word line when the MSB flag cell data of the first word line is in the second logic state when LSB flag cell data of the second word line is in the first logic state; and
    determining that the first word line is the finally written word line when the LSB flag cell data of the second word line is in the second logic state.

8. The method as claimed in claim 1, wherein determining whether the first word line is the finally written word line includes determining that the first word line is not the finally written word line when each flag cell data of the first word line is the same as corresponding flag cell data of the second word line.

9. The method as claimed in claim 1, wherein each of read voltages included in the second read voltage set are smaller than corresponding read voltages included in the first read voltage set by a correction amount.

10. The method as claimed in claim 9, wherein the correction amount is determined according to at least one of the flag cell data of the first word line and relative positions of the read voltages included in the second read voltage set.

11. A flash memory device comprising:
    a memory cell array including a plurality of memory cells;
    a row decoder configured to control a word line voltage applied to word lines of the memory cell array;
    a page buffer connected to the memory cell array through a plurality of bit lines and configured to read data of the plurality of memory cells included in the memory cell array; and
    a read voltage controller configured to receive at least one of flag cell data of a first word line and flag cell data of a second word line adjacent to the first word line from the page buffer and determine a read voltage set for memory cells corresponding to the first word line according to the received flag cell data, wherein the read voltage controller determines whether the first word line is a finally written word line according to the at least one received flag cell data, determines a first read voltage set as the read voltage set of the memory cells corresponding to the first word line, when the first word line is not the finally written word line, and determines a second read voltage set as the read voltage set of the memory cells corresponding to the first word line, when the first word line is the finally written word line.

12. The device as claimed in claim 11, wherein read voltages included in the second read voltage set are each smaller than corresponding read voltages included in the first read voltage set by a correction amount.

13. The device as claimed in claim 12, wherein the correction amount is determined according to at least one of the flag cell data of the first word line and relative positions of the read voltages included in the second read voltage set.

14. A method of reading a flash memory device including a plurality of memory cells corresponding to a first word line and a plurality of memory cells corresponding to a second word line, the method comprising:
    determining whether the first word line is a finally written word line based on flag cell data of the first word line and/or flag cell data of the second word line adjacent to the first word line; and
    reading the memory cells corresponding to the first word line, wherein reading includes:
        using a first voltage set during reading when the first word line is determined not to be the finally written word line, and
        using a second voltage set during reading when the first word line is determined to be the finally written word line, the first voltage set being different than the second voltage set.

15. The method as claimed in claim 14, wherein, during memory cell programming, memory cells corresponding to the first word line are programmed before memory cells corresponding to the second word line are programmed.

16. The method as claimed in claim 15, wherein the flag cell data of each of the first and second word lines includes most significant bit flag cell data and least significant bit flag cell data.

17. The method as claimed in claim 15, wherein determining whether the first word line is a finally written word line is based on at least the flag cell data of most significant bit data of the second word line.

18. The method as claimed in claim 14, wherein the first voltage set and the second voltage set each include at least one corresponding voltage distribution, the at least one corresponding voltage distribution of the first voltage set being relatively lower in voltage than the corresponding voltage distribution of the second voltage set.

* * * * *